United States Patent
Fann

(10) Patent No.: US 7,935,917 B2
(45) Date of Patent: May 3, 2011

(54) PHOTO DETECTOR DEVICE HAVING MULTIPLE PHOTOSENSITIVE TRANSISTORS

(75) Inventor: Sen-Shyong Fann, Hsinchu (TW)

(73) Assignee: Integrated Digital Technologies, Inc., Hsinchu (TW)

( * ) Notice: Subject to any disclaimer, the term of this patent is extended or adjusted under 35 U.S.C. 154(b) by 0 days.

(21) Appl. No.: 12/406,337

(22) Filed: Mar. 18, 2009

(65) Prior Publication Data

US 2009/0179243 A1 Jul. 16, 2009

Related U.S. Application Data

(62) Division of application No. 11/534,680, filed on Sep. 25, 2006, now Pat. No. 7,525,078.

(30) Foreign Application Priority Data

Oct. 7, 2005 (TW) ............................. 94135169 A

(51) Int. Cl.
*H01L 27/00* (2006.01)
*G05D 25/02* (2006.01)
(52) U.S. Cl. ................... 250/208.1; 250/214 R
(58) Field of Classification Search ........... 250/208.1, 250/214.1, 214 R; 348/272–283, 294, 302, 348/307, 308
See application file for complete search history.

(56) References Cited

U.S. PATENT DOCUMENTS

| 4,684,801 | A | 8/1987 | Carroll et al. |
| 4,988,983 | A | 1/1991 | Wehrer |
| 5,262,635 | A | 11/1993 | Curbelo |
| 5,705,807 | A | 1/1998 | Throngnumchai et al. |
| 6,046,466 | A | 4/2000 | Ishida et al. |
| 6,081,558 | A | 6/2000 | North |
| 6,350,981 | B1 | 2/2002 | Uno |
| 6,512,547 | B1 * | 1/2003 | Miida .............................. 348/310 |
| 6,947,102 | B2 * | 9/2005 | den Boer et al. ................. 349/12 |
| 7,002,547 | B2 | 2/2006 | Yamada |
| 7,023,503 | B2 | 4/2006 | den Boer |
| 7,030,360 | B2 | 4/2006 | Shimizu et al. |
| 7,184,009 | B2 | 2/2007 | Bergquist |
| 7,829,834 | B2 * | 11/2010 | Kim et al. .................. 250/208.1 |

(Continued)

FOREIGN PATENT DOCUMENTS

CN 1527254 9/2004

(Continued)

OTHER PUBLICATIONS

Abileah et al., "Integrated Optical Touch Panel in a 14.1" AMLCD"; SID 04 Digest (2004), 59.3, 1544-1547.
Destura et al., Novel Touch Sensitive In-Cell AMLCD; SID 04 Digest (2004), 3.5, 22-23.

*Primary Examiner* — Que T Le
*Assistant Examiner* — Pascal M Bui-Pho
(74) *Attorney, Agent, or Firm* — Finnegan, Henderson, Farabow, Garrett & Dunner, LLP

(57) ABSTRACT

A photo detector device includes a photosensitive transistor capable of detecting an optical signal including an image component and a background component and converting the optical signal into a current including an image current corresponding to the image component and a background current corresponding to the background component, a first amplifier module electrically connected to the photosensitive transistor capable of canceling the background current and amplifying the image current, and a second amplifier module electrically connected to the first amplifier module capable of detecting a direct-current (dc) portion of the image current.

6 Claims, 12 Drawing Sheets

U.S. PATENT DOCUMENTS

| | | |
|---|---|---|
| 2003/0111604 A1 | 6/2003 | Quek |
| 2003/0156087 A1 | 8/2003 | Boer et al. |
| 2003/0156230 A1 | 8/2003 | Boer et al. |
| 2005/0029611 A1* | 2/2005 | Jang et al. ............ 257/432 |
| 2005/0200296 A1 | 9/2005 | Naugler et al. |
| 2006/0262055 A1 | 11/2006 | Takahara |
| 2006/0267948 A1 | 11/2006 | Takahashi |
| 2006/0274056 A1 | 12/2006 | Saravanan et al. |
| 2007/0257890 A1 | 11/2007 | Hotelling et al. |

FOREIGN PATENT DOCUMENTS

| | | |
|---|---|---|
| EP | 0679869 | 11/1995 |
| EP | 1195576 B1 | 6/2008 |
| JP | 4-13360 | 1/1992 |
| JP | 6-11645 | 1/1994 |
| JP | 2000-162041 | 6/2000 |
| KR | 2001-0004005 | 1/2001 |

* cited by examiner

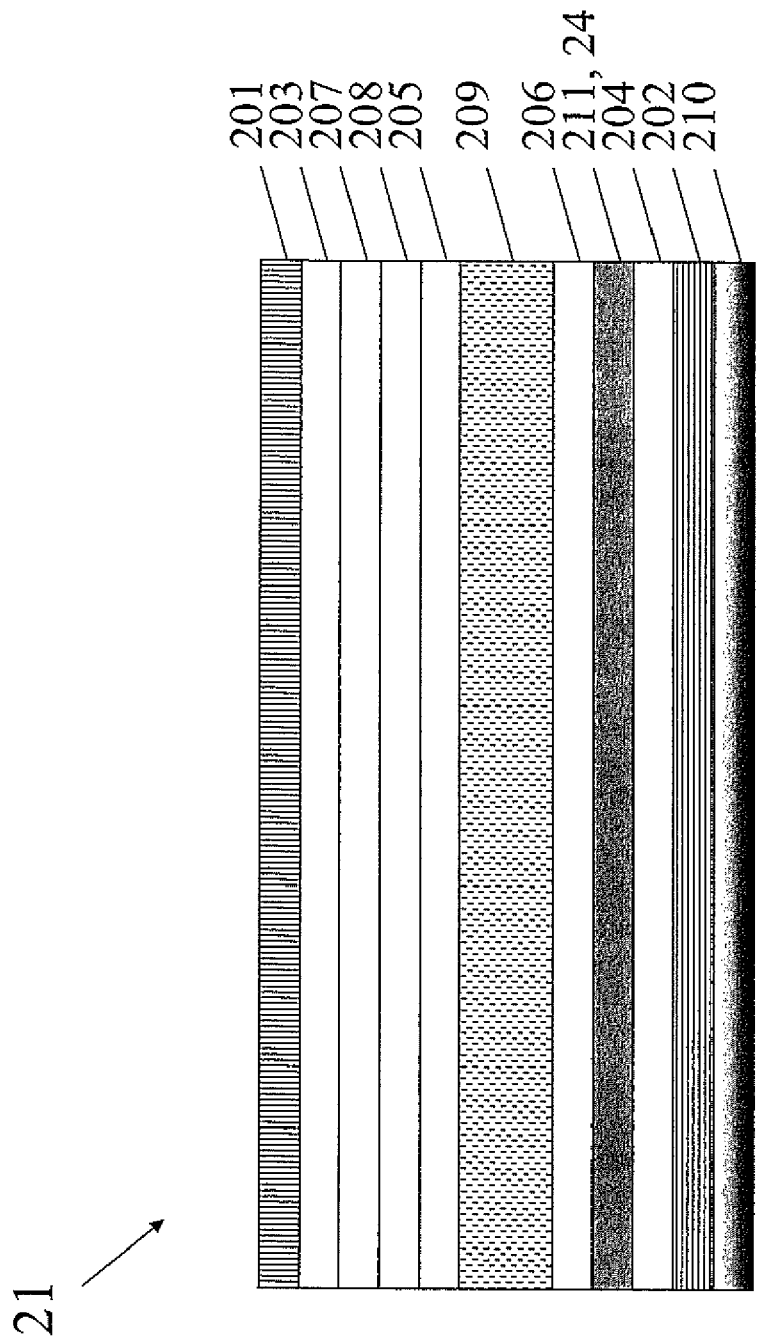

PHOTO DETECTOR DEVICE HAVING MULTIPLE PHOTOSENSITIVE TRANSISTORS

CROSS-REFERENCE TO RELATED APPLICATIONS

This application is a division of U.S. application Ser. No. 11/534,680, filed Sep. 25, 2006, now U.S. Pat. No. 7,525,078 which is based upon and claims the benefit of priority from prior Taiwanese Patent Application No. 094135169, filed on Oct. 7, 2005.

BACKGROUND OF THE INVENTION

The present invention relates generally to an image sensor, and more particularly, to a photo detector device capable of detecting an image input from a stylus, pen, torch or a shadow.

With the rapid development in the high-tech industry, pen tablets have been widely applicable to Personal Digital Assistants (PDAs), Personal Computers (PCs) and other electrical appliances used in our daily life. Generally, a pen tablet includes one of a resistor-type, electromagnetic inductance-type, capacitor-type and optoelectronic-type writing panel. As an example of the conventional optoelectronic-type pen tablet, an optical signal is converted into electrical charges, which in turn is stored in a capacitor of a detector array including capacitors, optoelectronic components and switch transistors before it is subsequently read. The capacitors may require additional areas and therefore adversely reduce the aspect ratio of the panel. Furthermore, the charges generated by a background light source and an input signal are equally stored in the capacitor, adversely resulting in a relatively narrow dynamic range. It is therefore desirable to have a photo detector device that is able to convert an optical signal into a photocurrent, eliminating the storing capacitors used in the conventional panels.

BRIEF SUMMARY OF THE INVENTION

Examples of the invention may provide a photo detector device that comprises a photosensitive transistor capable of detecting an optical signal including an image component and a background component and converting the optical signal into a current including an image current corresponding to the image component and a background current corresponding to the background component, a first amplifier module electrically connected to the photosensitive transistor capable of canceling the background current and amplifying the image current, and a second amplifier module electrically connected to the first amplifier module capable of detecting a direct-current (dc) portion of the image current.

Examples of the invention may also provide a photo detector device that comprises a plurality of first conductive lines extending in parallel with each other, a plurality of second conductive lines extending in parallel with each other and being orthogonal to the plurality of first conductive lines, and an array of optical detectors each of which is disposed near one of the plurality of first conductive lines and one of the plurality of the second conductive lines, and comprises a photosensitive transistor capable of detecting an optical signal including an image component and a background component and converting the optical signal into a current including an image current corresponding to the image component and a background current corresponding to the background component, a first amplifier module electrically connected to the photosensitive transistor capable of canceling the background current and amplifying the image current, and a second amplifier module electrically connected to the first amplifier module capable of detecting a direct-current (dc) portion of the image current.

Some examples of the invention may also provide a photo detector device that comprises a substrate, a gate electrode over the substrate, an insulating layer over the gate electrode and the insulating layer, a semiconductor layer over the insulating layer, a first diffused region over the semiconductor layer, a second diffused region over the semiconductor layer, and a third diffused region over the semiconductor layer and the gate electrode between the first diffused region and the second diffused region, wherein the first diffused region, the gate electrode and the third diffused region form a first photosensitive transistor capable of detecting an optical signal, and the second diffused region, the gate electrode and the third diffused region form a second photosensitive transistor capable of detecting an optical signal.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings examples consistent with the invention. It should be understood, however, that the invention is not limited to the precise arrangements and instrumentalities shown.

In the drawings:

FIG. 2C is a schematic cross-sectional diagram of a photo detector array incorporated in a thin film transistor liquid crystal display panel consistent with an example of the present invention;

DETAILED DESCRIPTION OF THE INVENTION

Reference will now be made in detail to the present embodiments of the invention, examples of which are illustrated in the accompanying drawings. Wherever possible, the same reference numbers will be used throughout the drawings to refer to the same or like parts.

Figure 1A:
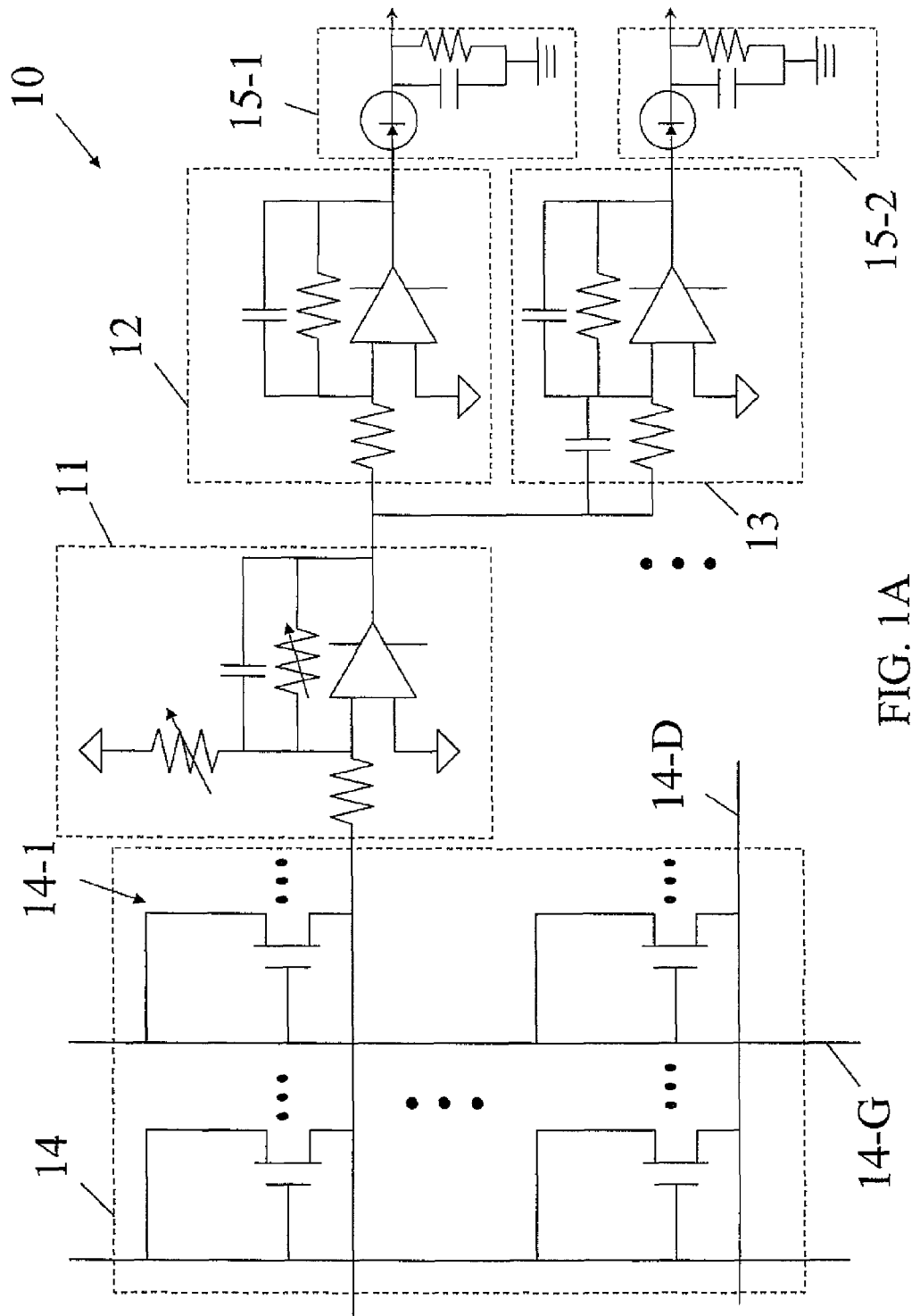
FIG. 1A is a schematic circuit diagram of a photo detector array consistent with an example of the present invention.

FIG. 1A is a schematic circuit diagram of a photo detector array 10 consistent with an example of the present invention. Referring to FIG. 1A, the photo detector array 10 includes a photosensitive transistor array 14, and a first amplifier module 11, a second amplifier module 12 and a third amplifier module 13 electrically connected to each row of the photosensitive transistor array 14. The photosensitive transistor array 14 includes a plurality of photosensitive transistors 14-1 formed in rows and columns. A representative photosensitive transistor 14-1 is disposed near an intersection of one of a plurality of gate lines 14-G and one of a plurality of data lines 14-D orthogonal to the gate lines 14-G. Each of the plurality of data lines 14-D is electrically connected to the first amplifier module 11, which in turn is electrically connected to the second amplifier module 12 and the third amplifier module 13 connected in parallel with the second amplifier module 12. The photo detector array 10 may further include a first detector 15-1 and a second detector 15-2, which are electrically connected to the second amplifier module 12 and the third amplifier module 13, respectively.

Figure 1B:
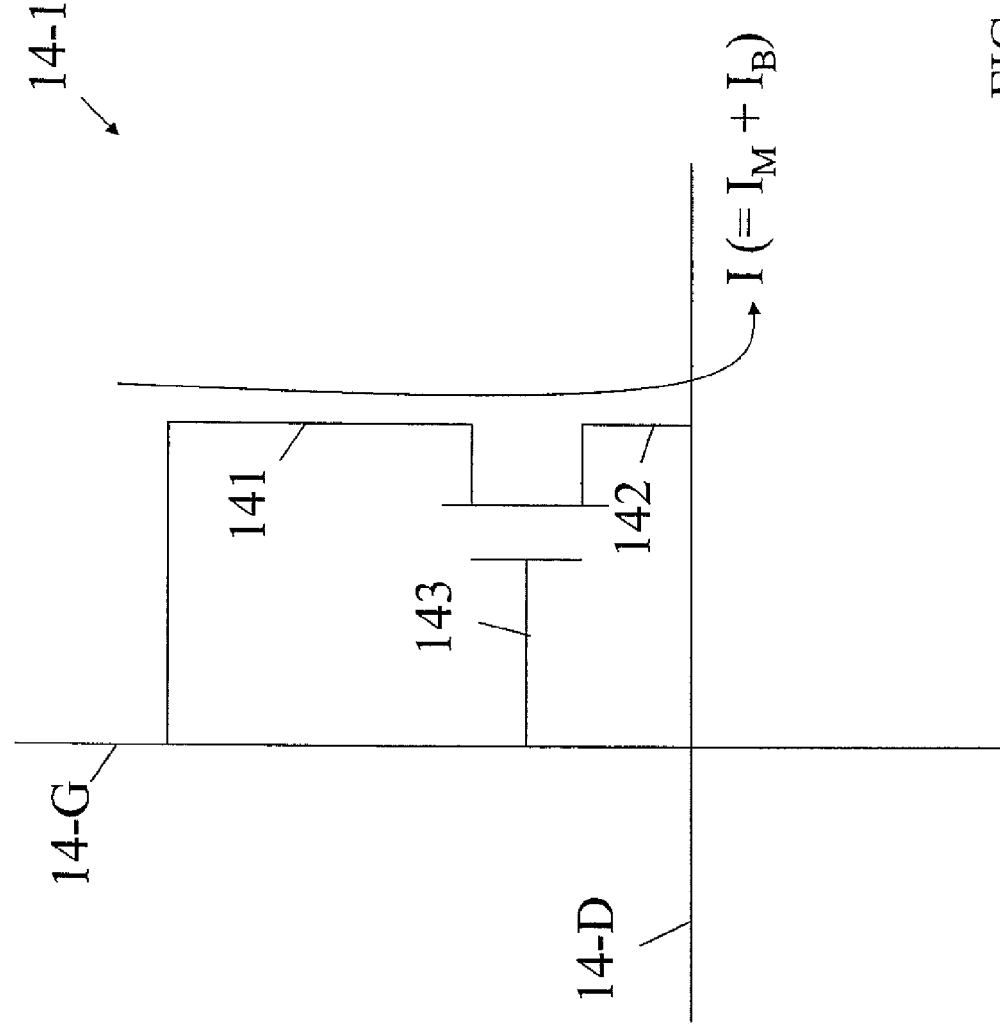
FIG. 1B is an enlarged circuit diagram of a photosensitive transistor of the photo detector array illustrated in FIG. 1A.

FIG. 1B is an enlarged circuit diagram of the photosensitive transistor 14-1 of the photo detector array 10 illustrated in FIG. 1A. The photosensitive transistor 14-1 functions to detect light and serve as a switch. Referring to FIG. 1B, the photosensitive transistor 14-1 includes a first electrode 141, a second electrode 142 and a gate electrode 143. The first electrode 141, which serves as a drain of the photosensitive transistor 14-1, is connected to the gate line 14-G. The second electrode 142, which serves as a drain of the photosensitive transistor 14-1, is connected to the data line 14-D. The gate electrode 143 is connected to the gate line 14-G and this is short-circuited to the first electrode 141, which prevents parasitic capacitance from accumulation therebetween. In the absence of an input optical signal provided from, for example, a light source such as a stylus or torch, a pressure source such as a force applied from an ordinary pen or fingertip, or even the shadow of an object, only the background light will be detected by the photosensitive transistor 14-1 if the gate line 14-G is selected. The background light is converted to a photo current $I_B$, which is generally a relatively small current. In the presence of an input optical signal, the photosensitive transistor 14-1 generates a current I if the gate line 14-G is selected. The current I includes an image current $I_M$ due to the input optical signal and the photo current $I_B$ due to the background light. The current I is provided to the first amplifier module 11.

Figure 1C:
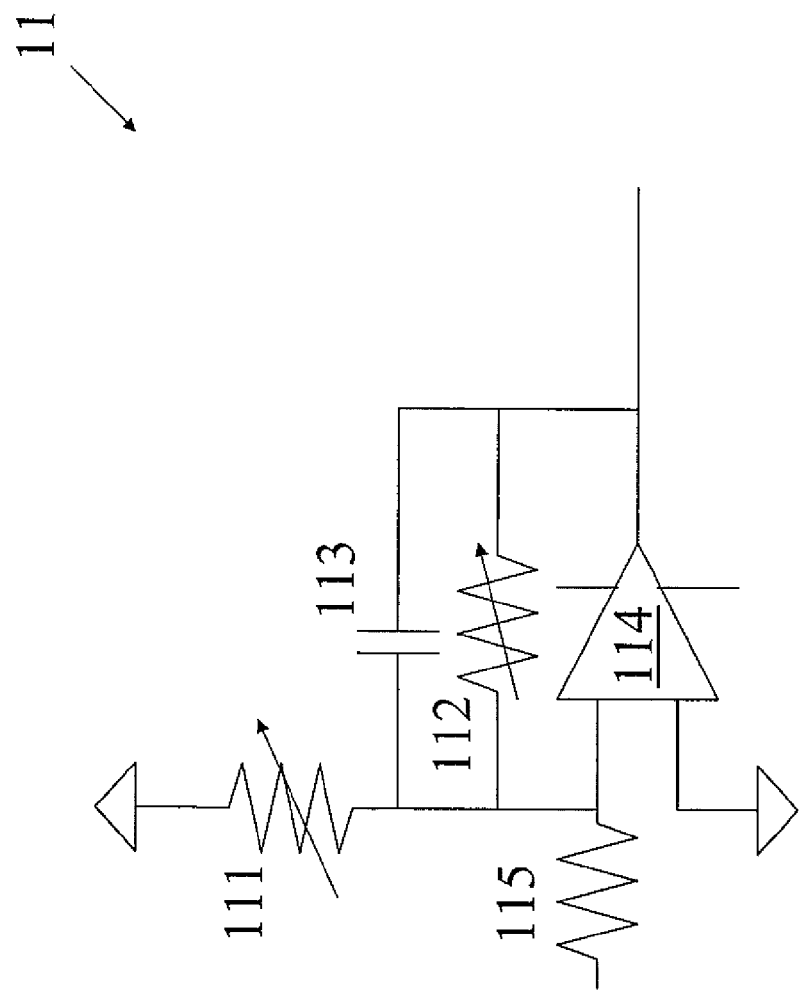
FIG. 1C is an enlarged circuit diagram of a first amplifier module of the photo detector array illustrated in FIG. 1A.

FIG. 1C is an enlarged circuit diagram of the first amplifier module 11 of the photo detector array 10 illustrated in FIG. 1A. Referring to FIG. 1C, the first amplifier module 11 includes a first variable resistor 111, a second variable resistor 112, a capacitor 113, an operational amplifier 114 and a resistor 115. The first amplifier module 11 functions to obtain the image current $I_M$ out of the current I by removing the photo current $I_B$. The resistance of the first variable resistor 111 varies as the photo current $I_B$ varies. Specifically, the resistance of the first variable resistor 111 is automatically adjusted in response to the variation in the background light intensity so as to provide differential signal compensation. Therefore, the photo current $I_B$ is cancelled in the operational amplifier 114 due to a differential amplifier circuit function. As a result, interference caused by the background light is minimized, which enhances the system sensitivity and expands the dynamic range of the photo detector array 10.

In the absence of an input optical signal, the first variable resistor 111 maintains an output voltage of the first amplifier module 11 at a stable level. That is, the gain of the first amplifier module 11 may be designed with a substantially large value (but not infinite) such that the signal response is sensitive enough to determine whether an input optical signal is light or shadow. In one example consistent with the present invention, when an output value is smaller than the level, it is determined that an input optical signal is provided by a stylus. Furthermore, when an output value is greater than the level, it is determined that an input optical signal is provided by a shadow. In another example, when an output value is greater than the level, it is determined that an input optical signal is provided by a stylus. Furthermore, when an output value is smaller than the level, it is determined that an input optical signal is provided by a shadow. In still another example, the stable level is a gray scale value 128, given 8 bits per pixel. A relatively white-color optical input signal has a gray scale value ranging from 128 to 255, while a relatively black-color optical input signal has a gray scale value ranging from 0 to 128. The compensation process therefore compensates for the variation in the background light and the differences of optoelectronic characteristics of the plurality of photosensitive transistors 14-1 as well. Consequently, the output voltage of each of the plurality of photosensitive transistors 14-1 of the photo detector array 10 is maintained at a stable level in the absence of an input optical signal. Therefore, a stylus may be used as an entry tool. Similarly, the shadow of finger, chopstick or ordinary pen may also serve as an entry tool. In one example, an input optical signal having a diameter of approximately 3 millimeter or greater is detectable by the photo detector array 10.

Figure 1D:
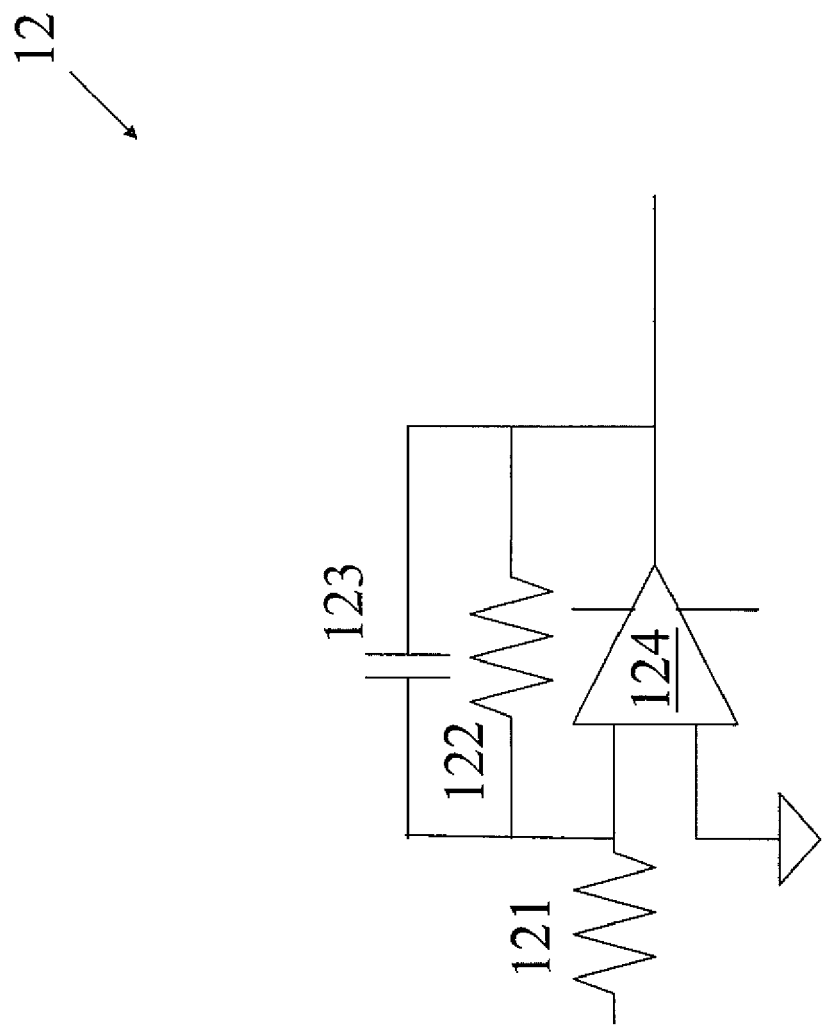
FIG. 1D is an enlarged circuit diagram of a second amplifier module of the photo detector array illustrated in FIG. 1A.

FIG. 1D is an enlarged circuit diagram of the second amplifier module 12 of the photo detector array 10 illustrated in FIG. 1A. Referring to FIG. 1D, the second amplifier module 12 includes a first resistor 121, a second resistor 122, a capacitor 123 and an operational amplifier 124. The second resistor 122 and the capacitor 123 form a low pass filter. The second amplifier module 12 functions to process a direct-current (dc) component of a signal provided by the first amplifier module 11. Specifically, the second amplifier module 12 filters out or attenuates frequencies higher than the cutoff frequency of the low pass filter, thereby reducing the high-frequency noise in the dc component. The dc component is generated by an optical input through, for example, a general stylus, pen, torch, finger or chopstick. In one example consistent with the present invention, the photo detector array 10 includes an analog-to-digital converter (not shown) of a multiplexer (not shown) electrically connected to the second amplifier module 12 at a subsequent stage to further process the dc component.

Figure 1E:
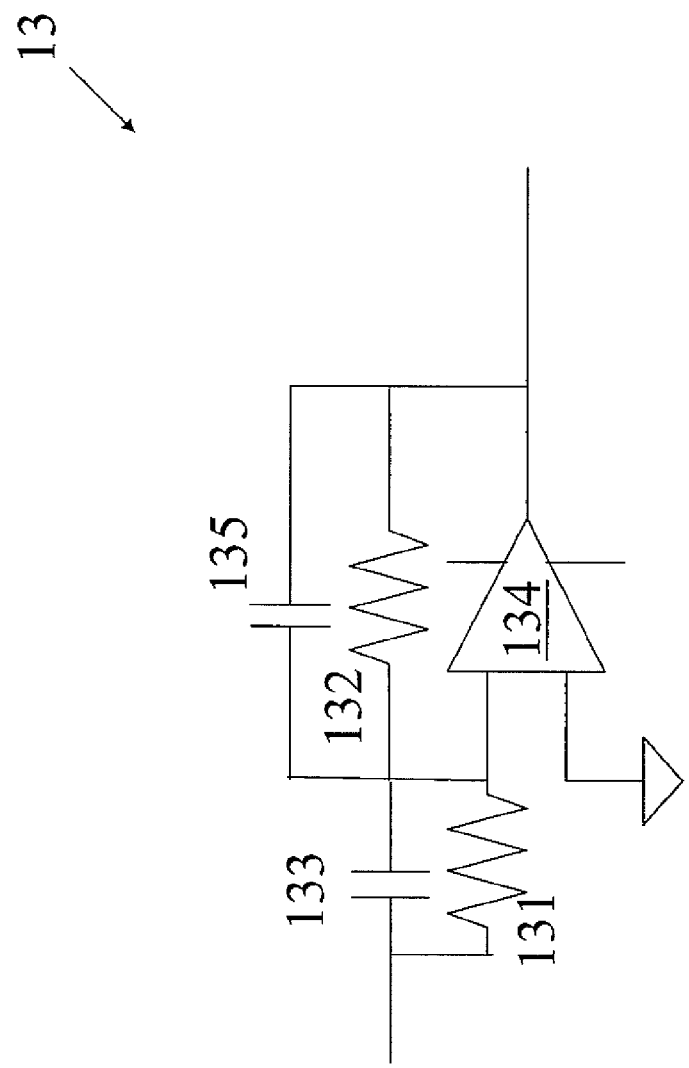
FIG. 1E is an enlarged circuit diagram of a third amplifier module of the photo detector array illustrated in FIG. 1A.

FIG. 1E is an enlarged circuit diagram of the third amplifier module 13 of the photo detector array 10 illustrated in FIG. 1A. Referring to FIG. 1E, the third amplifier module 13 includes a first resistor 131, a second resistor 132, a first capacitor 133, a second capacitor 135 and an operational amplifier 134. The third amplifier module 13 functions to serve as a band pass filter, and process an alternating-current (ac) component of a signal provided by the first amplifier module 11. The ac component is generated by an optical input through, for example, a dedicated stylus having a specific output specification such as frequency. The third amplifier module 13 is able to detect a modulated optical signal from the dedicated stylus, which converts a force applied therethrough on a panel into a frequency. In one example consistent with the present invention, the photo detector array 10 includes a phase-locked-loop ("PLL") circuit (not shown)

electrically connected to the third amplifier module 13 at a subsequent stage to convert the frequency of the dedicated stylus into a voltage signal.

Referring to FIG. 1A, each of the first detector 15-1 and the second detector 15-2 includes a diode (not numbered) and a low pass filter (not numbered) connected in parallel with the diode. The second detector 15-2 is able to detect the amplitude of the signal from the third amplifier module 13.

Figure 2A:
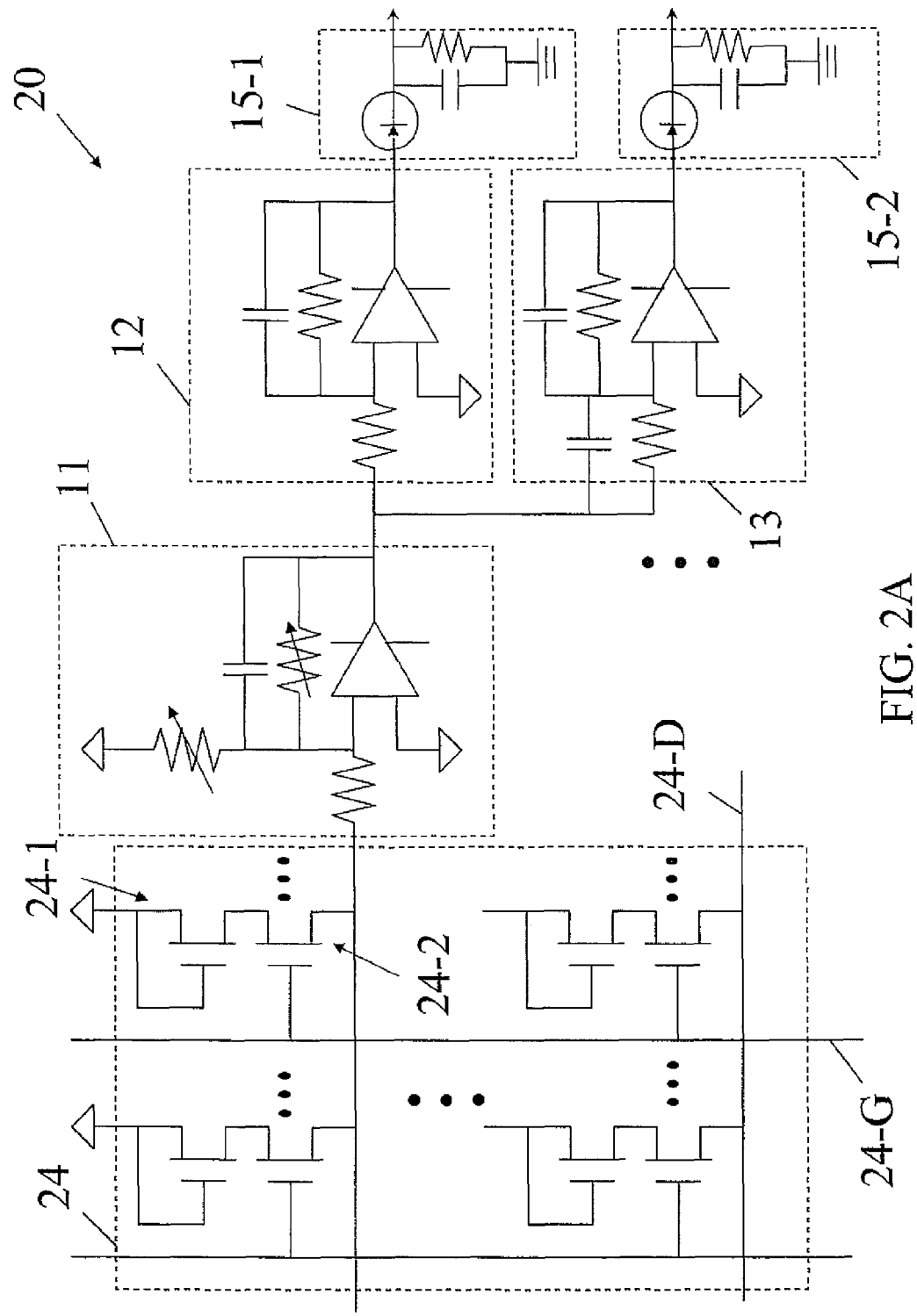
FIG. 2A is a schematic diagram of a photo detector array consistent with another example of the present invention.

FIG. 2A is a schematic diagram of a photo detector array 20 consistent with another example of the present invention. Referring to FIG. 2A, the photo detector array 20 is similar to the photo detector array 10 illustrated in FIG. 1A except a photosensitive transistor array 24. The photosensitive transistor array 24 includes a plurality of photosensitive transistors 24-1 and a plurality of switching transistors 24-2 formed in rows and columns. A representative photosensitive transistor 24-1 and a representative switching transistor 24-2 are disposed near an intersection of one of a plurality of gate lines 24-G and one of a plurality of data lines 24-D orthogonal to the gate lines 24-G.

Figure 2B:
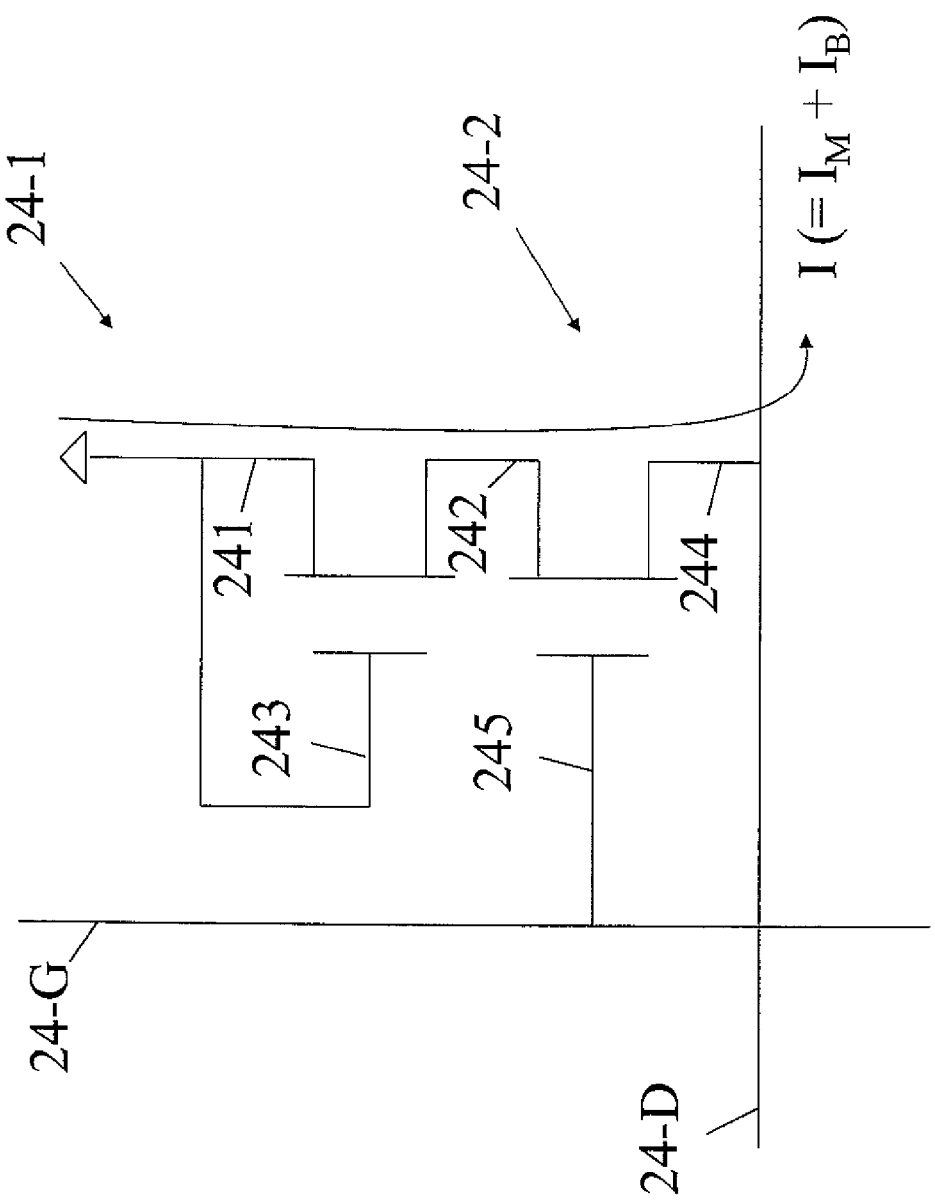
FIG. 2B is an enlarged circuit diagram of a photosensitive transistor and a switching transistor of the photo detector array illustrated in FIG. 2B.

FIG. 2B is an enlarged circuit diagram of the photosensitive transistor 24-1 and the switching transistor 24-2 of the photo detector array 20 illustrated in FIG. 2B. Referring to FIG. 2B, the photosensitive transistor 24-1 includes a first electrode 241, a second electrode 242 and a gate electrode 243, which serve as a drain, source and gate of the photosensitive transistor 24-1, respectively. The first electrode 241 and the gate electrode 243 are short-circuited to prevent parasitic capacitance from accumulation therebetween. The switching transistor 24-2 includes a first electrode 242, a second electrode 244 and a gate electrode 245, which serve as a drain, source and gate of the switching transistor 24-2, respectively. The gate electrode 245 is connected to the gate line 24-G, and the second electrode 244 is connected to the data line 24-D.

In the absence of an input optical signal provided from, for example, a stylus, an ordinary pen, a torch, a fingertip or even the shadow of an object, only the background light will be detected by the photosensitive transistor 24-1 if the gate line 24-G is selected, which turns on the switching transistor 24-2 and the photosensitive transistor 24-1. The background light is converted to a photo current $I_B$. In the presence of an input optical signal, the photosensitive transistor 24-1 generates a current I if the gate line 24-G is selected. The current I includes an image current $I_M$ due to the input optical signal and the photo current $I_B$ due to the background light. The current I is provided to the first amplifier module 11.

FIG. 2C is a schematic cross-sectional diagram of the photo detector array 24 incorporated in a thin film transistor liquid crystal display panel 21 consistent with an example of the present invention. Referring to FIG. 2C, the panel 21 includes a pair of polarizers 201, 202, a pair of glass substrates 203, 204, a pair of alignment films 205, 206, a color filter film 207, a common electrode 208, a liquid crystal cell 209, a backlight unit 210 and a thin film transistor ("TFT") layer 211. The photo detector array 24 is formed in the TFT layer 211. In one example consistent with the present invention, the gate lines 24-G illustrated in FIG. 2B serve as a portion of gate lines for switching transistors in the TFT layer 211.

Figure 3A:
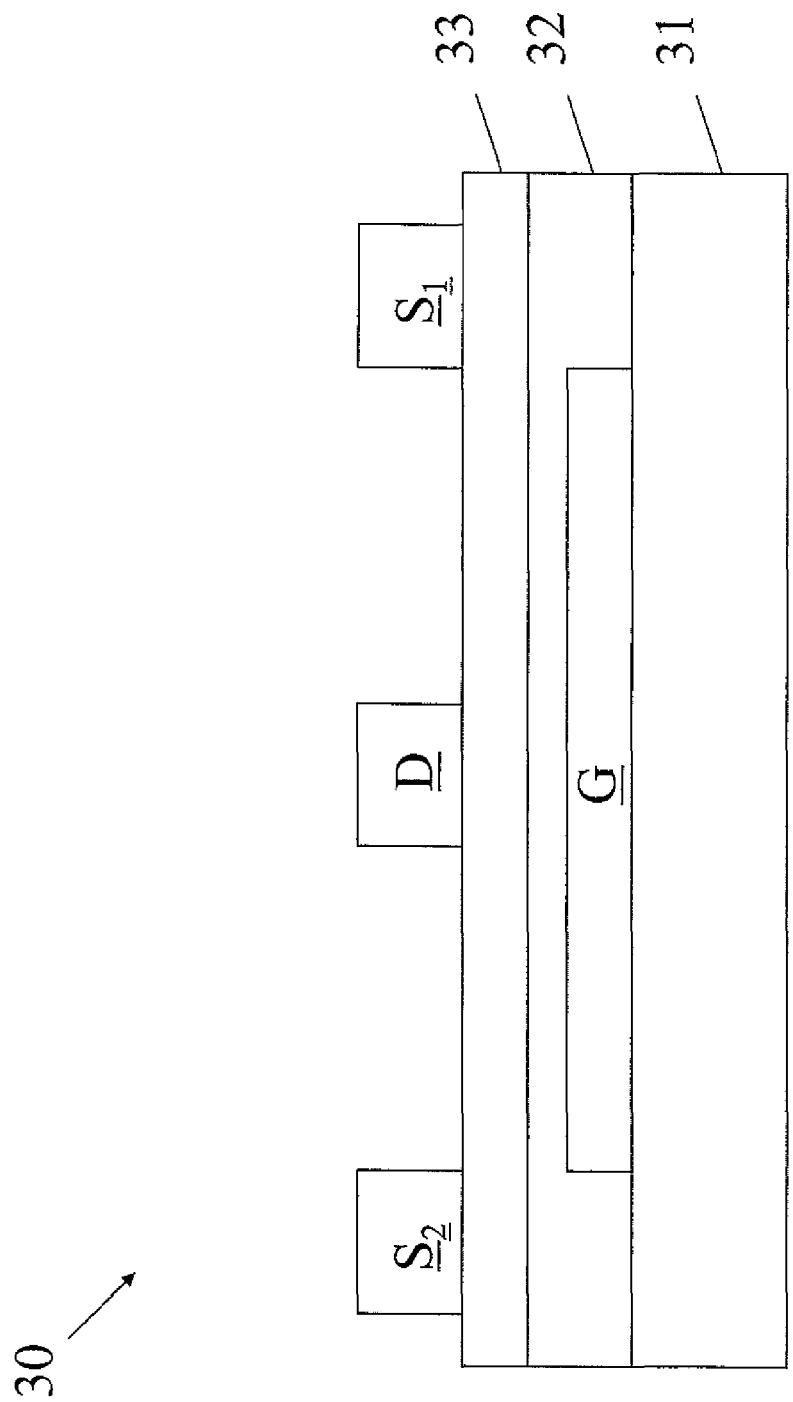
FIGS. 3A and 3B are respectively a cross-sectional view and a top view of a photo detector device consistent with examples of the present invention.
Figures 3B, 3C:
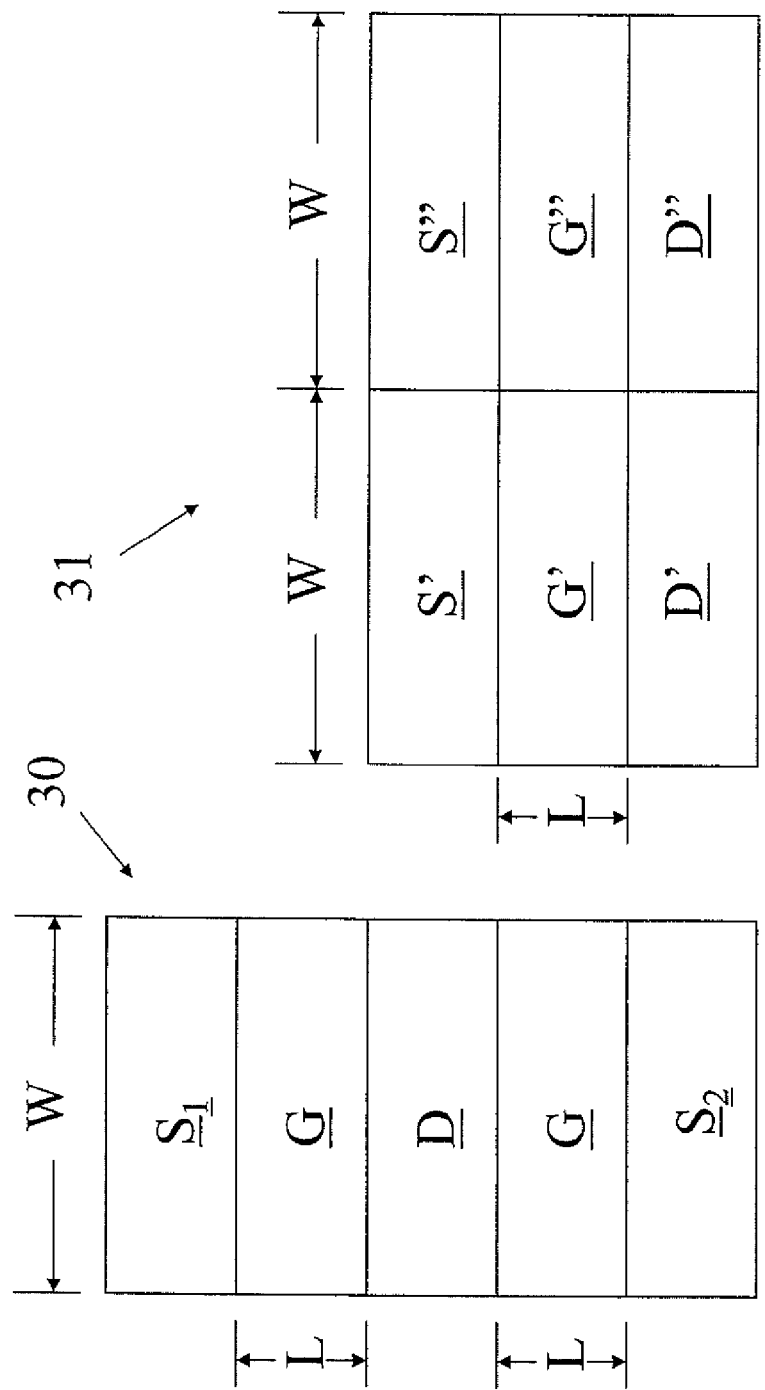
FIG. 3C is a top view of a conventional photo detector device.

FIGS. 3A and 3B are respectively a cross-sectional view and a top view of a photo detector device 30 consistent with examples of the present invention. Referring to FIG. 3A, the photo detector device 30 includes a substrate 31, a gate electrode "G" over the substrate 31, an insulating layer 32 over the gate electrode G, a semiconductor layer 33 over the insulating layer 32, and a first source electrode "$S_1$", a drain electrode "D" and a second source electrode "$S_2$" over the semiconductor layer 33. To avoid accumulation of parasitic capacitance, the drain electrode D and the gate electrode G are coupled to one another as illustrated in FIG. 1A. In the present example, the gate electrode G is aligned with the first source electrode $S_1$ and the second source electrode $S_2$. In other examples, the gate electrode G may cross over a portion of the first source electrode $S_1$ or the entire first source electrode $S_1$. Similarly, the gate electrode G may cross over a portion of the second source electrode $S_2$ or the entire second source electrode $S_2$. Referring to FIG. 3B, the photo detector device 30 includes two channel widths "W" and therefore two folds of channel width-to-length ratio, i.e., 2 (W/L), L being the channel length, in five unit areas, each of which is substantially equal to a source or drain electrode area.

FIG. 3C is a top view of a conventional photo detector device 31. To achieve the same two folds of channel width-to-length ratio, a total number of six unit areas are required in the conventional photo detector device 31, including a first channel width defined by a first set of source, drain and gate electrodes S', D' and G', respectively, and a second channel width defined by a second set of source, drain and gate electrodes S", D" and G", respectively. By comparison, the photo detector device 30 illustrated in FIG. 3A or 3B is more area effective than the conventional photo detector device 31.

Figure 4A:
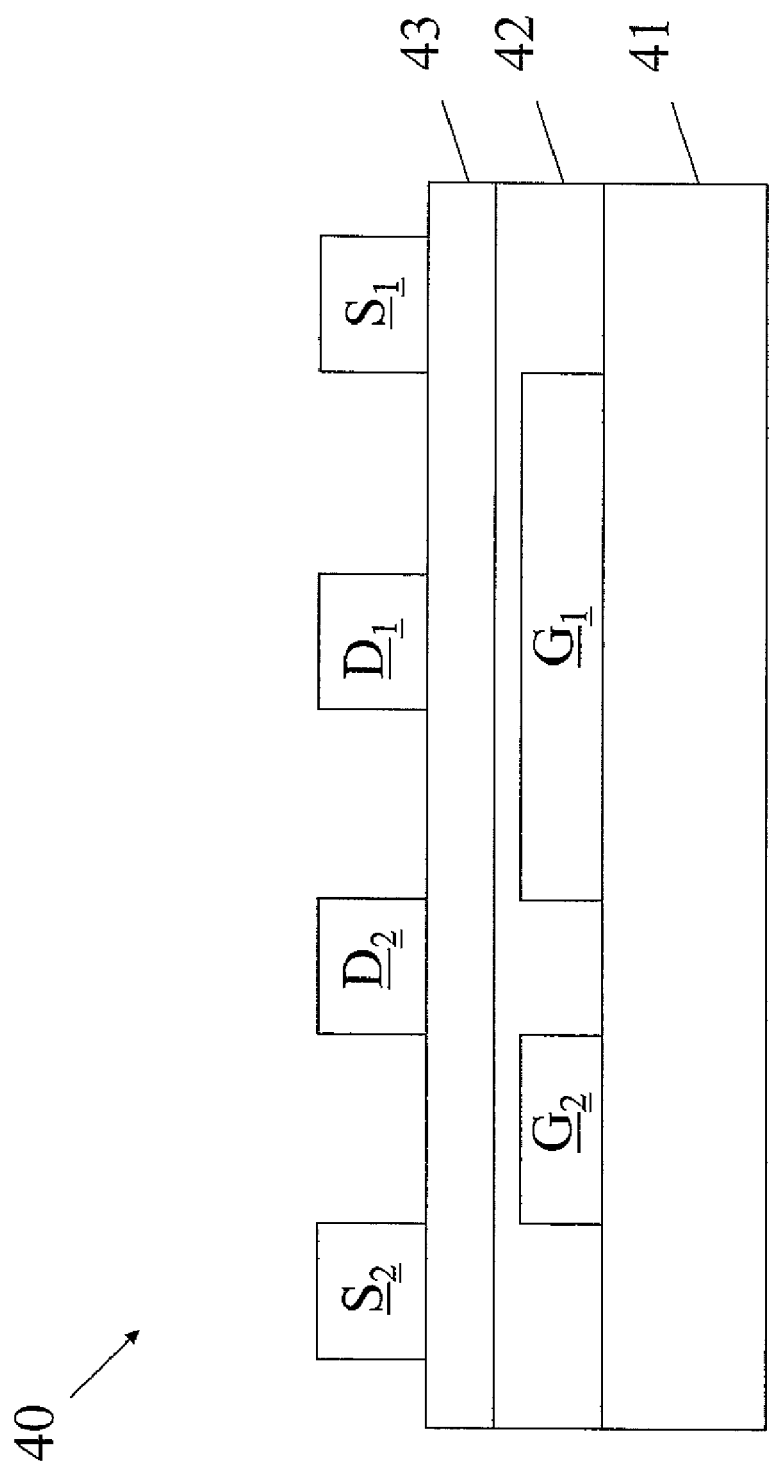
FIGS. 4A and 4B are respectively a cross-sectional view and a top view of a photo detector device consistent with examples of the present invention.
Figures 4B, 4C:
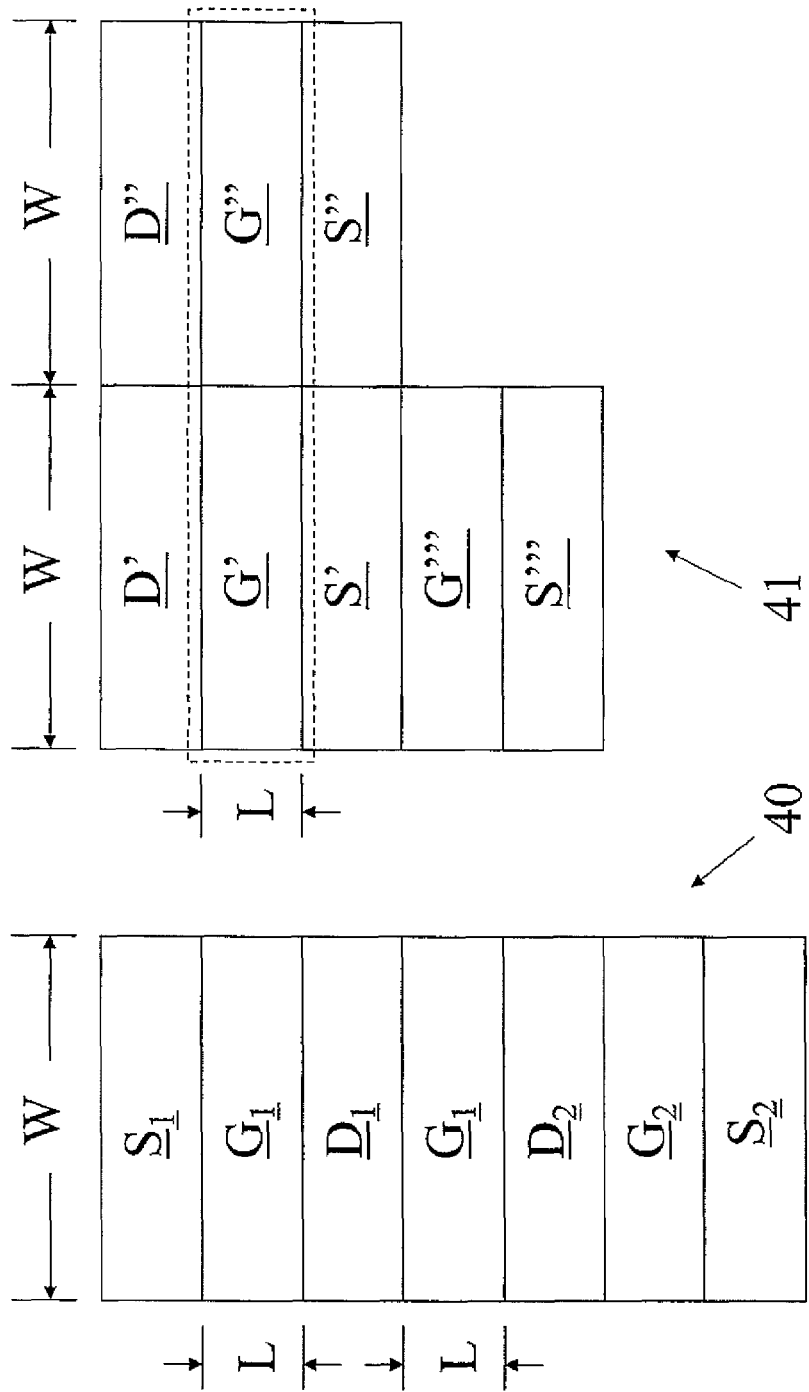
FIG. 4C is a top view of another conventional photo detector device.

FIGS. 4A and 4B are respectively a cross-sectional view and a top view of a photo detector device 40 consistent with examples of the present invention. Referring to FIG. 4A, the photo detector device 40 includes a substrate 41, a first gate electrode "$G_1$" and a second gate electrode "$G_2$" over the substrate 41, an insulating layer 42 over the gate electrodes $G_1$ and $G_2$, a semiconductor layer 43 over the insulating layer 42, and a first source electrode "$S_1$", a first drain electrode $D_1$, a second drain electrode $D_2$ and a second source electrode $S_2$ over the semiconductor layer 43. The first gate electrode $G_1$ and the second gate electrodes $G_2$ are the gates of a photosensitive transistor and a switching transistor, respectively. To avoid accumulation of parasitic capacitance, the first drain electrode $D_1$ and the first gate electrode $G_1$ are coupled to one another as illustrated in FIG. 2A. The first gate electrode $G_1$ may overlap the first source electrode $S_1$ or the second drain electrode $D_2$ or both. The second gate electrode $G_2$ is aligned with the second source electrode $S_2$ and the second drain electrode $D_2$. In other examples, however, the second gate electrode $G_2$ may cross over a portion of the second source electrode $S_2$ or the entire second source electrode $S_2$. Similarly, the second gate electrode $G_2$ may cross over a portion of the second drain electrode $D_2$ or the entire second drain electrode $D_2$. Referring to FIG. 4B, the photo detector device 40 includes two channel widths "W" and therefore two folds of channel width-to-length ratio, i.e., 2 (W/L), in seven unit areas.

FIG. 4C is a top view of another conventional photo detector device 41. To achieve the same two folds of channel width-to-length ratio, a total number of eight unit areas are required in the conventional photo detector device 41, including a first channel width defined by a first set of source, drain and gate electrodes S', D' and G', respectively, and a second channel width defined by a second set of source, drain and gate electrodes S", D" and G", respectively. A third transistor including S''', G''' and S'''' serves as a switching transistor. By comparison, the photo detector device 40 illustrated in FIG. 4A or 4B is more area effective than the conventional photo detector device 41.

It will be appreciated by those skilled in the art that changes could be made to one or more of the examples described above without departing from the broad inventive concept thereof. It is understood, therefore, that this invention is not limited to the particular examples disclosed, but it is intended to cover modifications within the scope of the present invention as defined by the appended claims.

Further, in describing certain illustrative examples of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

I claim:

1. A photo detector device, comprising:
    a substrate;
    a common gate electrode over the substrate;
    an insulating layer over the common gate electrode and the substrate;
    a semiconductor layer over the insulating layer;
    a first diffused region and a second diffused region both disposed over the semiconductor layer and the common gate electrode, wherein the common gate electrode is between the first diffused region and the second diffused region;
    a third diffused region over the semiconductor layer and the common gate electrode,
    wherein the first diffused region, the common gate electrode and the third diffused region form a first photosensitive transistor capable of detecting an optical signal, and the second diffused region, the common gate electrode and the third diffused region form a second photosensitive transistor capable of detecting an optical signal, and
    wherein the common gate electrode is a first gate electrode, the device further comprising:
    a second gate electrode over the substrate; and
    a fourth diffused region over the semiconductor layer and the second gate electrode, wherein the fourth diffused region, the second gate electrode and one of the first diffused region and the second diffused region from a switching transistor capable driving the first and second photosensitive transistors.

2. The device of claim 1, wherein the common gate electrode extends to below at least a portion of at least one of the first diffused region and the second diffused region.

3. The device of claim 1, wherein the common gate electrode is aligned with an edge of at least one of the first diffused region and the second diffused region.

4. A photo detector device, comprising:
    a first photosensitive transistor capable of detecting an optical signal, the first photosensitive transistor comprising:
        a first diffused region;
        a second diffused region; and
        a common gate electrode, the first diffused region and the second diffused region being over the common gate electrode; and
    a second photosensitive transistor capable of detecting an optical signal, the second photosensitive transistor comprising:
        the second diffused region;
        a third diffused region; and
        the common gate electrode, the third diffused region being over the common gate electrode and the second diffused region being between the first diffused region and the third diffused region, and
    a switching transistor capable of driving the first and second photosensitive transistors, the switching transistor comprising:
        the first or third diffused region;
        a fourth diffused region; and
        a switching transistor gate electrode, the fourth diffused region being over the switching transistor gate electrode.

5. The device of claim 4, wherein the common gate electrode extends to below at least a portion of the first diffused region and the third diffused region.

6. The device of claim 4, wherein the common gate electrode is aligned with an edge of at least the first diffused region and the third diffused region.

* * * * *